US007183699B2

(12) United States Patent
Maruyama et al.

(10) Patent No.: US 7,183,699 B2
(45) Date of Patent: Feb. 27, 2007

(54) STACKED TYPE ELECTRO-MECHANICAL ENERGY CONVERSION ELEMENT AND VIBRATION WAVE DRIVING APPARATUS

(75) Inventors: Yutaka Maruyama, Taito-ku (JP); Kiyoshi Nitto, Saitama (JP)

(73) Assignee: Canon Kabushiki Kaisha (JP)

( * ) Notice: Subject to any disclaimer, the term of this patent is extended or adjusted under 35 U.S.C. 154(b) by 124 days.

(21) Appl. No.: 11/151,375

(22) Filed: Jun. 13, 2005

(65) Prior Publication Data

US 2005/0275318 A1 Dec. 15, 2005

(30) Foreign Application Priority Data

Jun. 15, 2004 (JP) ............................ 2004-176707

(51) Int. Cl.
*H01L 41/047* (2006.01)
*H02N 2/00* (2006.01)

(52) U.S. Cl. ................ 310/365; 310/366; 310/323.01; 310/323.06

(58) Field of Classification Search .............................. 310/323.01–323.19, 365, 366
See application file for complete search history.

(56) References Cited

U.S. PATENT DOCUMENTS 4,786,836 A * 11/1988 Tokushima ............ 310/323.07
4,814,659 A * 3/1989 Sawada ...................... 310/328
5,814,919 A * 9/1998 Okumura ............... 310/323.12
7,098,577 B2 * 8/2006 Mehta ........................ 310/332
2001/0028206 A1 * 10/2001 Watanabe et al. ........... 310/366
2002/0149301 A1 * 10/2002 Maruyama et al. ......... 310/366
2005/0001519 A1 * 1/2005 Sasaki et al. ............... 310/365
2005/0104482 A1 * 5/2005 Sasaki ........................ 310/366
2006/0061241 A1 * 3/2006 Sasaki ........................ 310/366

FOREIGN PATENT DOCUMENTS

JP 05-146178 * 6/1993 ................. 310/365
JP 08-308268 * 11/1996
JP 3311034 B2 5/2002
JP 3313782 B2 5/2002
JP 2003-134858 A 5/2003
JP 3432321 B2 5/2003
JP 2003-199376 A 7/2003
JP 2003-209983 A 7/2003

* cited by examiner

*Primary Examiner*—Thomas M. Dougherty
(74) *Attorney, Agent, or Firm*—Rossi, Kimms & McDowell, LLP

(57) ABSTRACT

A stacked type electromechanical energy conversion element which is compact in size and capable of providing higher output power and enhanced operating efficiency. A plurality of electrode layers are formed, respectively, on one surfaces of a plurality of piezoelectric layers, and the material layers and said electrode layers are stacked one upon another. Electrodes are formed at least in the plurality of material layers for providing electrical connections between corresponding ones of the plurality of electrode layers. The plurality of electrode layers have a non-uniform configuration depending on a predetermined strain distribution that is to occur in the stacked type electromechanical energy conversion element.

10 Claims, 7 Drawing Sheets

STACKED TYPE ELECTRO-MECHANICAL ENERGY CONVERSION ELEMENT AND VIBRATION WAVE DRIVING APPARATUS

BACKGROUND OF THE INVENTION

1. Field of the Invention

The present invention relates to a stacked type electro-mechanical energy conversion element and a vibration wave driving apparatus.

2. Description of the Related Art

Conventionally, a vibration wave motor such as one 90 shown in FIG. 6 has been used for example, as an autofocusing motor for camera lenses.

In FIG. 6, the vibration wave motor 90 is comprised of a bolt member 91, a vibrator 92 and a rotating unit 93 into both of which a shaft of the bolt member 91 is inserted, and a nut member 94 screwed onto the bolt member 91 to clamp the rotating unit 93 in cooperation with the vibrator 92.

The vibrator 92 is comprised of a metal elastic body 95, a printed circuit board (PCB) 96 connected to an external power supply (not shown), a stacked piezoelectric element 97, and a metal elastic body 98 that cooperates with the elastic body 95 to hold the PCB 96 and the stacked piezoelectric element 97 therebetween. These component parts are arranged in the order mentioned as viewed from a head 91*a* of the bolt member 91.

The rotating unit 93 is comprised of a gear 99 rotatably supported on the nut member 94 via a ball bearing, a rotor 100 rotatable in unison with the gear 99 and disposed in contact with the elastic body 100, a spring 101 urging the rotor 100 against the head 91*a* of the bolt member 91 in a direction away from the gear 99, and a spring support 102. These component parts are arranged in the order mentioned as viewed from the nut member 94.

The spring 101 serves to press the rotor 100 against the elastic body 98.

The stacked piezoelectric element 97 has a stacked structure formed of a plurality of ceramic layers (piezoelectric layers) that are stacked one upon another. These ceramic layers have an electromechanical energy conversion function and are formed at their respective one surface with electrode layers (hereinafter referred to as "the internal electrodes") of an electrode material. With this stacked structure, application of low voltage may result in a high deformation strain and a large force. Such stacked piezoelectric elements are disclosed in, for example, Japanese Patent Publications Nos. 3,311,034, 3,313,782, and 3,432,321.

FIGS. 7A and 7B are views useful in explaining the stacked piezoelectric element 97 of FIG. 6, in which FIG. 7A is a perspective view of the device 97, and FIG. 7B is an exploded perspective view thereof.

Specifically, FIGS. 7A and 7B show a stacked piezoelectric element disclosed in Japanese Patent Publication No. 3,432,321.

As illustrated in FIG. 7A, the stacked piezoelectric element 97 has a circular or disk shape with a central opening formed therein. The dimensions are an outer diameter of 10 mm, an inner diameter of 2.8 mm and a thickness of approximately 2.3 mm. As shown in FIG. 7B, the stacked piezoelectric element 97 is comprised of a first or uppermost piezoelectric layer 110, and second to twenty-fifth layers in which piezoelectric layers 111 and 112 are alternately disposed. The piezoelectric layers 110, 111, and 112 each have a thickness of approximately 90 micrometers (μm).

Each piezoelectric layer 111 has a surface thereof facing toward the first or uppermost layer, which is formed with four segmented internal electrodes A+, B+, A−, and B−. Similarly, each piezoelectric layer 112 has a surface thereof facing the uppermost layer, which is formed with four segmented internal electrodes AG+, BG+, AG−, and BG−. The internal electrodes A+, B+, A−, B− of the piezoelectric layer 111 have the same inner and outer diameters as the internal electrodes AG+, BG+, AG−, BG− of the piezoelectric layer 112. The thickness of each internal electrode is approximately 2 to 3 μm.

The piezoelectric layers 111 and 112 are each formed therein with eight through electrodes 113 with an electrode material filled therein for causing corresponding internal electrodes to electrically conduct. Among these through electrodes, four through electrodes 113 are arranged to cause the respective corresponding segmented internal electrodes A+, B+, A−, and B− of the alternate piezoelectric layers 111 to electrically conduct independently. The other four through electrodes 113 are arranged to cause the respective corresponding segmented internal electrodes AG+, BG+, AG−, and BG− of the alternate piezoelectric layers 112 to electrically conduct independently. The twenty-fifth piezoelectric layer 112, which is the lowermost layer, has no through electrodes.

The through electrodes 113 extend through the stacked structure and have their respective one ends 113*a* exposed to an outer/upper surface of the first piezoelectric layer 110 where the one ends 113*a* are in direct contact with the PCB 96 and electrically connected to wiring conductors (not shown) on the PCB 96.

The stacked piezoelectric element 97 performs polarization by applying positive voltage to the internal electrodes A+ and B+ out of the four segmented internal electrodes of the piezoelectric layers 111 and negative voltage to the internal electrodes A− and B− of the same with the internal electrodes AG+, BG−, AG− and BG− grounded such that the paired internal electrodes A+, A− and the paired internal electrodes B+, B−, each pair being offset by 180 degrees, are opposite in polarity, i.e. one is positive, and the other is negative. The vibration wave motor 90 applies high-frequency voltage almost equal to the natural frequency of the vibrator 97 to an A phase to which the electrodes A+ and A− correspond, with the electrodes AG+, AG− corresponding to an AG phase and facing the A phase and the electrodes BG+, BG− corresponding to a BG phase and facing a B phase to which the electrodes B+ and B− correspond, the B phase being different by 90 degrees in spatial phase from the A phase, being grounded. Further, the vibration wave motor 90 applies high-frequency voltage equal in natural frequency to and electrically different in phase by 90 degrees from the high-frequency voltage applied to the A phase to the B phase. This causes the vibrator 92 to generate two bending vibrations intersecting with each other, whereby driving vibrations are obtained by synthesis of the generated two bending vibrations to thereby frictionally drive the rotor 100 disposed in urging contact with one end face of the elastic body 98 via the spring 101.

As stated above, the stacked piezoelectric element 97 of the conventional vibration wave motor 90 has the internal electrodes of uniform dimensions (inner and outer diameters) throughout the stacked structure. This is because the stacked piezoelectric element 97 will produce a relatively even strain distribution though there are some variations (a1), (b1) and (c1) in strain depending on locations in the device 97, as shown in FIG. 8, and hence the internal electrodes can be uniform in dimensions. FIG. 8 is a fragmentary vertical sectional view of a half of the piezoelectric element in the radial direction, useful in explaining strains over the piezoelectric element.

Recently, there is a strong demand for a vibration wave motor of this type to be more compact in size, higher in efficiency, and higher in output so as to be applicable to various appliances, as disclosed in Japanese Laid-Open Patent Publications (Kokai) Nos. 2003-134858, 2003-199376, and 2003-209983.

Vibration wave motors disclosed in the above-mentioned publications are still insufficient in efficiency and output, leaving room for improvement of the stacked piezoelectric element thereof. Specifically, analysis of the structure of the stacked piezoelectric element has revealed that in small-sized vibration wave motors, to produce efficient vibrations of the vibrator, strains generated in the stacked piezoelectric element should have such a distribution that the strains largely vary in the thickness or stacked direction and in the radial direction of the stacked piezoelectric element.

That is, if all the internal electrodes of the stacked piezoelectric element are configured to have uniform dimensions as in the conventional stacked piezoelectric element, strains occur even in a region where inherently strains should not be generated or a region where inverse strains, i.e. strains caused by compression should be generated, which can cause loss of supplied electric power, and hence degraded operating efficiency and insufficient output of the vibration wave motor.

SUMMARY OF THE INVENTION

It is an object of the invention to provide a stacked type electromechanical energy conversion element and a vibration wave driving apparatus which are compact in size and capable of providing higher output power and enhanced operating efficiency of a motor thereof.

To attain the above object, in a first aspect of the present invention, there is provided a stacked type electromechanical energy conversion element comprising a plurality of stacked electromechanical energy conversion material layers having one surfaces, a plurality of electrode layers formed, respectively, on the one surfaces of the plurality of material layers, the material layers and the electrode layers being stacked one upon another, and electrodes formed at least in the plurality of material layers for providing electrical connections between corresponding ones of the plurality of electrode layers, wherein the plurality of electrode layers have a non-uniform configuration depending on a predetermined strain distribution that is to occur in the stacked type electromechanical energy conversion element.

Preferably, the stacked type electromechanical energy conversion element has one surface thereof located on one side thereof in a direction in which the material layers and the electrode layers are stacked, and the plurality of electrode layers have outer diameters gradually decreasing toward the one surface of the device.

Preferably, the stacked type electromechanical energy conversion element has one surface thereof located on one side thereof in a direction in which the material layers and the electrode layers are stacked, and the plurality of electrode layers have inner diameters gradually decreasing toward the one surface of the device.

Preferably, each of the plurality of electrode layers has a circular shape.

Alternatively, each of the plurality of electrode layers has a polygonal shape.

More preferably, the polygonal shape is a square.

To attain the above object, in a second aspect of the present invention, there is provided a vibration wave driving apparatus comprising a vibrator having a surface thereof, the vibrator including a stacked type electromechanical energy conversion element for inducing a vibration wave on the surface of the vibrator, when electrically driven, and a moving unit disposed in contact with the surface of the vibrator, the moving unit being driven by the vibration wave, wherein the stacked type electromechanical energy conversion element comprises a plurality of stacked electromechanical energy conversion material layers having one surfaces, a plurality of electrode layers formed, respectively, on the one surfaces of the plurality of material layers, the material layers and the electrode layers being stacked one upon another, and electrodes formed at least in the plurality of material layers for providing electrical connections between corresponding ones of the plurality of electrode layers, and wherein the plurality of electrode layers have a non-uniform configuration depending on a predetermined strain distribution that is to occur in the stacked type electromechanical energy conversion element.

Preferably, the plurality of electrode layers have outer diameters gradually decreasing toward the moving unit.

Preferably, the plurality of electrode layers have inner diameters gradually decreasing toward the moving unit.

Preferably, the vibrator comprises first, second, and third elastic bodies, the first elastic body, the stacked type electromechanical energy conversion element, the second elastic body, and the third elastic body are arranged in an order mentioned, and the stacked type electromechanical energy conversion element has an outer diameter smaller than that of the second elastic body and larger than that of the third elastic body.

The above and other features and advantages of the present invention will be apparent from the following detailed description taken in conjunction with the accompanying drawings, in which like reference numerals or characters designate the same or similar parts throughout the figures thereof.

DETAILED DESCRIPTION OF THE PREFERRED EMBODIMENTS

Figure 1:
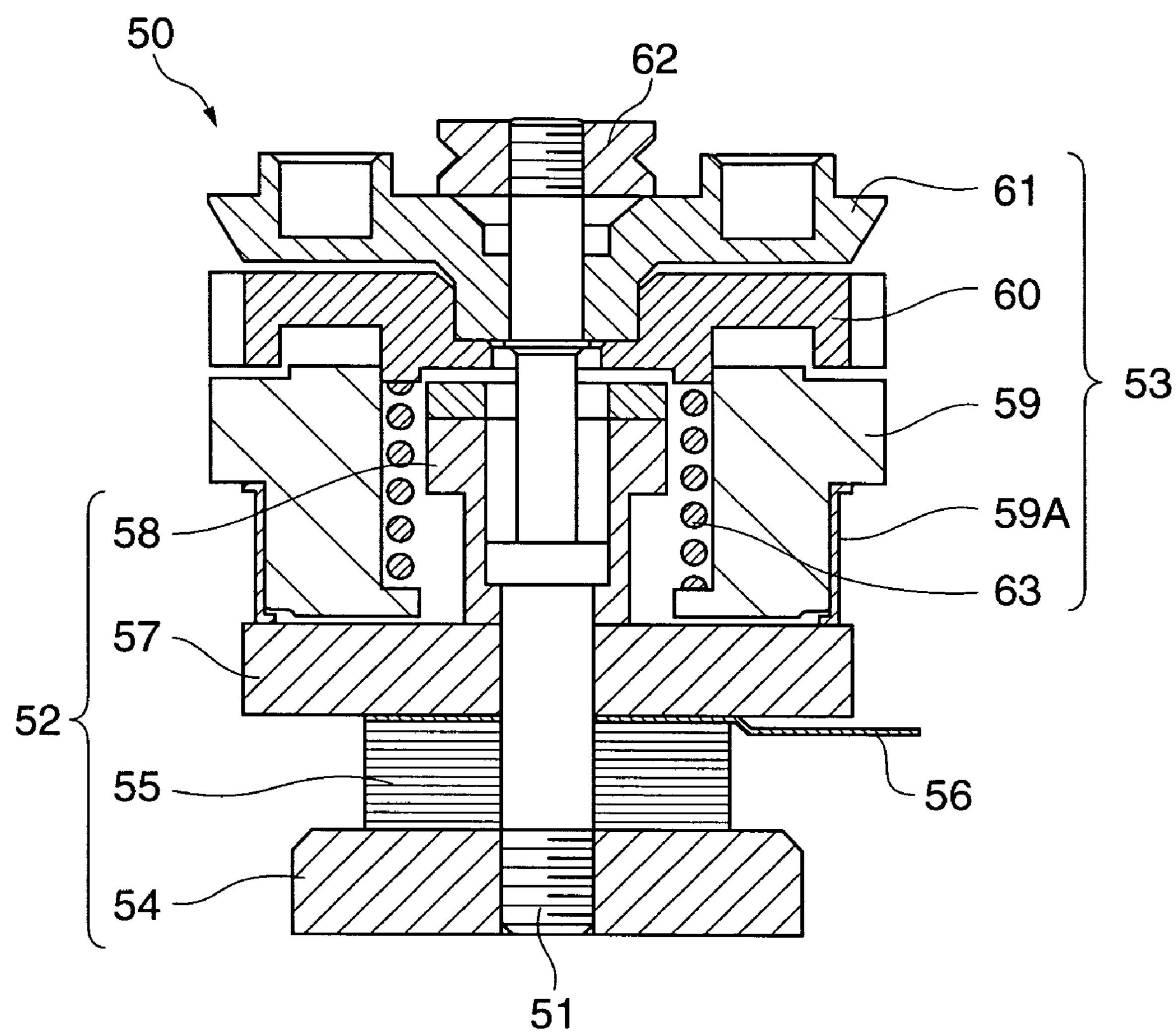
FIG. 1 is a cross-sectional view of a vibration wave motor according to a first embodiment of the present invention.

The present invention will now be described with reference to the drawings showing preferred embodiments thereof. In the drawings, like reference numerals designate the same or similar elements or parts throughout the figures thereof.

FIG. 1 shows a cross-sectional view of a vibration wave motor according to a first embodiment of the present invention.

Figure 6:
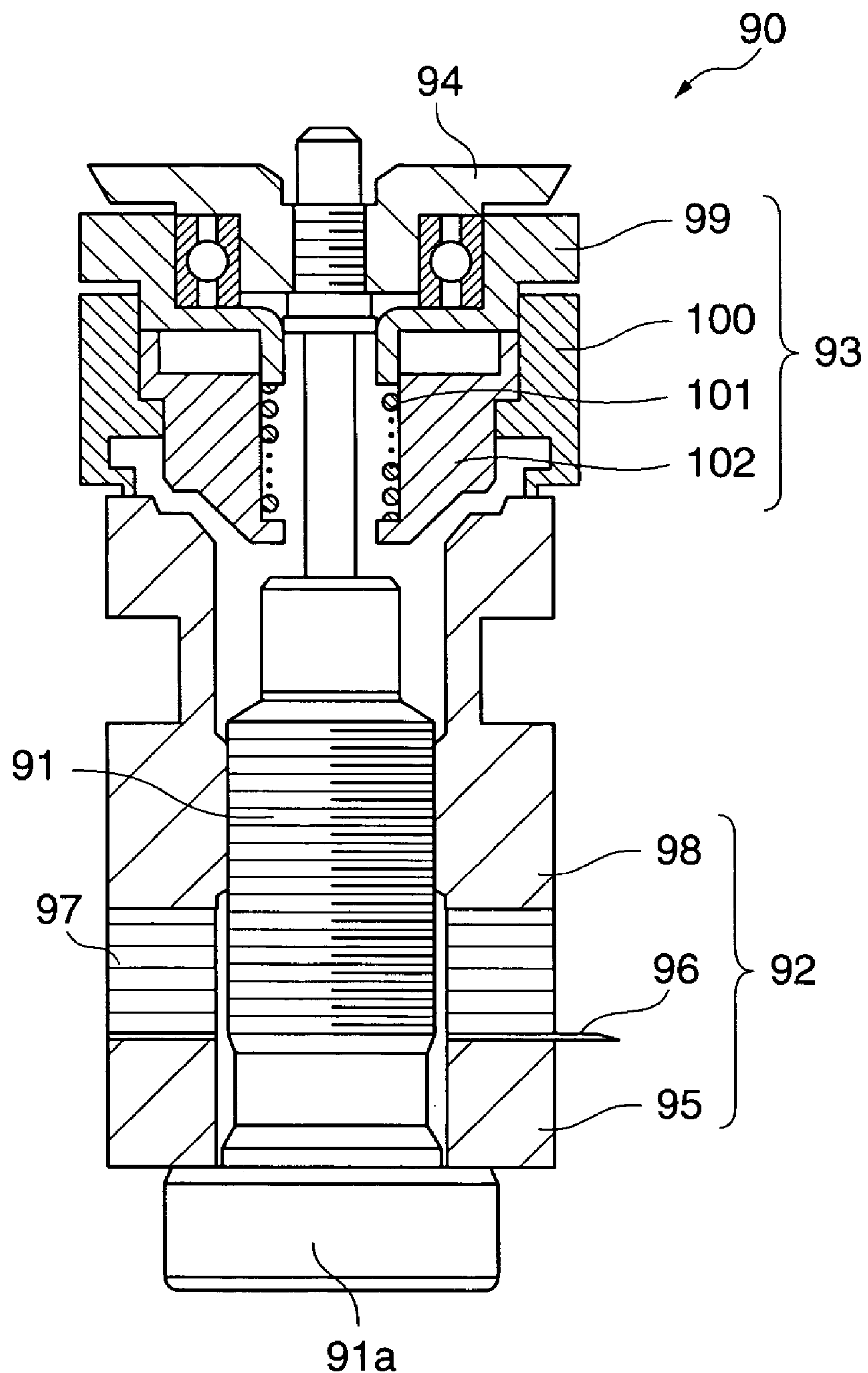
FIG. 6 is a cross-sectional view of a conventional vibration wave motor.

As shown in FIG. 1, the vibration wave motor 50 is comprised of a shaft 51, a vibrator 52, a rotating unit 53, the vibrator 52 and the rotating unit 53 being fitted around the shaft 51, and a nut member 62 screwed onto the shaft 51 to clamp the rotating unit 53 in cooperation with the vibrator 52. The vibration wave motor 50 can provide equivalent almost as large output torque as that provided by the motor 90, although it is shorter in entire length and more compact in size than the conventional vibration wave motor 90 shown in FIG. 6.

The vibrator 52 is comprised of a metal elastic body 54 screwed onto one end of the shaft 51, a stacked piezoelectric element 55 (FIG. 2) as a stacked type electromechanical energy conversion element, a printed circuit board (PCB) 56 connected to an external power supply (not shown), a metal elastic body 57, and a metal elastic body 58 that cooperates with the elastic body 54 to hold the stacked piezoelectric element 55, the PCB 56 and the elastic body 57 therebetween. These component parts are arranged in the order mentioned. The stacked piezoelectric element 55 is configured to have an outer diameter smaller than that of the elastic body 57 and greater than that of the elastic body 58.

The rotating unit 53 is comprised of a rotor 59 fitted on the shaft 51 in a manner being movable axially thereof and inhibited from rotating, a gear 60 as an output member rotatably fitted on the shaft 51 on the side close to an upper end of the rotor 59, a disk member 61 rigidly fitted on an upper end of the shaft 51, and a spring 63 disposed inside the rotor 59 between the rotor 59 and the gear 60 and urging the rotor 59 and the gear 60 in directions away from each other. A contact ring 59A is fitted on a lower end of the rotor 59, with a lower end thereof in contact with the elastic body 57.

The spring 63 urges the rotor 59 against the elastic body 57 to keep the same in contact with the elastic body 57.

The PCB 56 is comprised of patterned conductors for wiring (not shown) which are in tight mechanical contact with one end 14 of each of through electrodes exposed to a surface of the stacked piezoelectric element 55 (FIG. 2), and conductors on the PCB 56 are electrically connected to the through electrodes.

Figure 2A:
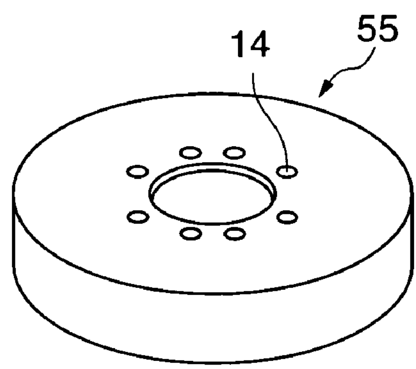
FIG. 2A is a perspective view of a stacked piezoelectric element appearing in FIG. 1.
Figure 2B:
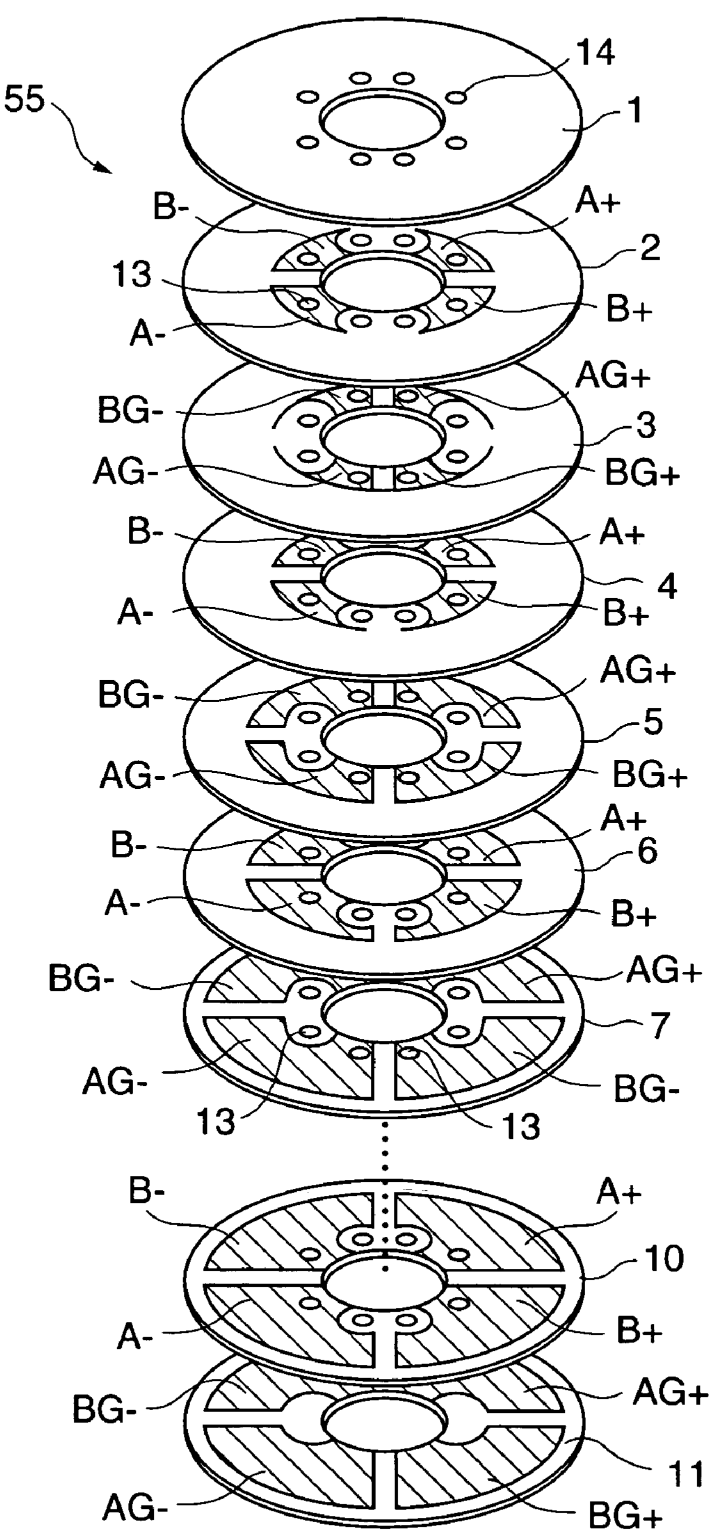
FIG. 2B is an exploded perspective view of the stacked piezoelectric element in FIG. 1.

FIGS. 2A and 2B illustrate the stacked piezoelectric element 55 of FIG. 1. Specifically, FIG. 2A is a perspective view of the piezoelectric element 55, and FIG. 2B is an exploded perspective view of the piezoelectric element 55.

As illustrated in FIG. 2A, the stacked piezoelectric element 55 has a generally circular or disk shape with a central opening formed therein. The stacked piezoelectric element 55 has an outer diameter of 6 mm, an inner diameter of 1.7 mm and a thickness of approximately 0.7 mm. As shown in FIG. 2B, the stacked piezoelectric element 55 is comprised of a first or uppermost ceramic layer (hereinafter referred to as "the piezoelectric layer") 1, and second to eleventh piezoelectric ceramic layers 2 to 11. Each of these layers 1 to 11 is circular in shape, serves as an electromechanical energy conversion layer, and has a thickness of approximately 60 micrometers (μm). It should be noted, however, that the above-mentioned dimensions are given only as an example. The dimensions may have other values depending on parameters required for a specific stacked piezoelectric element, such as output power and entire length.

Figure 7A:
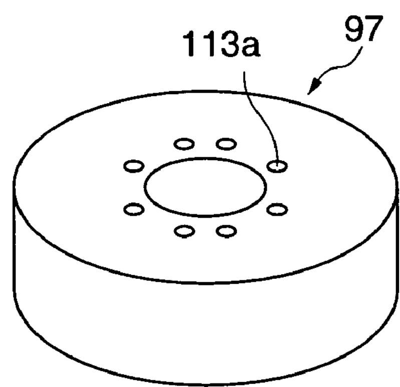
FIG. 7A is a perspective view of a stacked piezoelectric element appearing in FIG. 6.
Figure 7B:
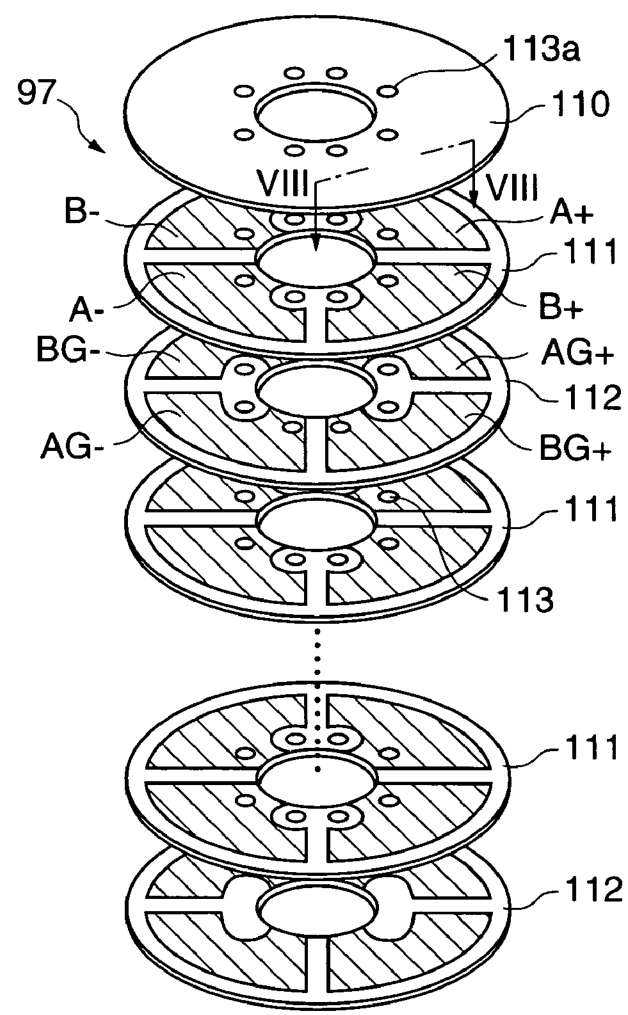
FIG. 7B is an exploded perspective view of the stacked piezoelectric element in FIG. 6.
Figure 8:
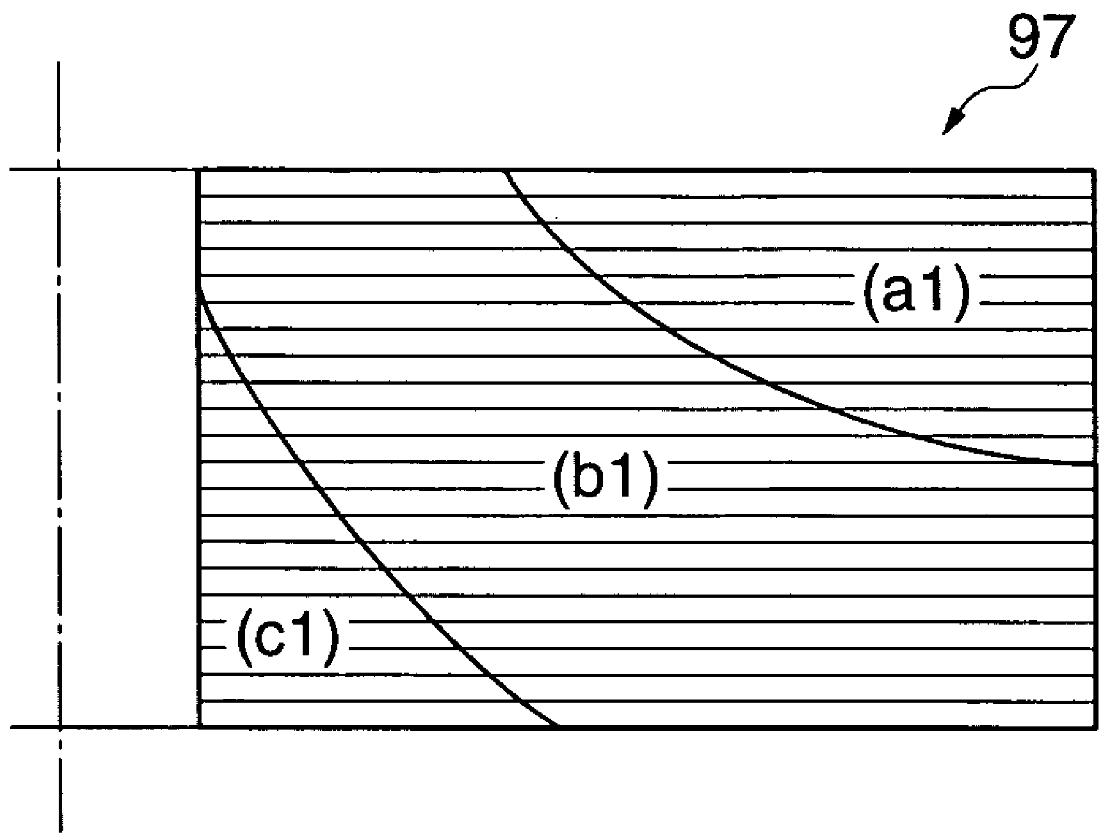
FIG. 8 is a fragmentary vertical cross-sectional view useful in explaining a strain distribution in a conventional stacked piezoelectric element appearing in FIGS. 7A and 7B.

The even-numbered piezoelectric layers 2, 4, - - - , 10 each have an electrode layer of an electrode material formed in a surface thereof facing the uppermost layer 1. The electrode layer includes four segmented electrodes (internal electrodes) A+, B+, A−, and B− that are separated from one another by a generally cross-shaped slit where no electrode is formed. Except for the first layer 1, the odd-numbered piezoelectric layers 3, 5, - - - , 11 each also have four segmented internal electrodes AG+, BG+, AG−, and BG− formed in a surface thereof facing the uppermost layer 1. The thickness of each internal electrode may be approximately 2 to 3 μm. While the internal electrodes of the conventional stacked piezoelectric element 97 in FIGS. 7A and 7B are uniform in dimensions (inner and outer diameters), the internal electrodes of the stacked piezoelectric element 55 of FIGS. 2A and 2B have non-uniform dimensions such that the internal electrodes of the piezoelectric layers 5 and 6 have an outer diameter smaller than that of the internal electrodes of the piezoelectric layers 7 to 11, and the internal electrodes of the piezoelectric layers 2 to 4 have a further smaller outer diameter. The ground for setting such different dimensions will be described later.

The piezoelectric layers 1 to 11 are each formed therein with eight through electrodes 13 with an electrode material filled therein for causing corresponding internal electrodes to electrically conduct. Among the through electrodes, four through electrodes 13 are arranged to cause the respective segmented internal electrodes A+, B+, A−, and B− of the even-numbered alternate piezoelectric layers 2, 4, 6, 8 and 10 to electrically conduct independently. The other four through electrodes 13 are arranged to cause the respective segmented internal electrodes AG+, BG+, AG−, and BG− of the odd-numbered alternate piezoelectric layers 3, 5, 7, 9 and 11 to electrically conduct independently. The eleventh piezoelectric layer 112 as the lowermost layer has no though-electrodes.

The through electrodes 13 extend though the stacked structure and their respective ends 14 are exposed to an outer/upper surface of the first piezoelectric layer 1, so that the ends 14 are in direct contact with the PCB 56 and electrically connected to wiring conductors (not shown) on the PCB 56.

The stacked piezoelectric element 55 performs polarization by applying positive voltage to the internal electrodes A+ and B+ out of the four segmented internal electrodes of the piezoelectric layers 2, 4, 6, 8, and 10 and negative voltage to the internal electrodes A− and B− of the same with the internal electrodes AG+, BG−, AG− and BG− grounded such that the paired internal electrodes A+, A− and the paired internal electrodes B+, B−, each pair being offset by 180 degrees, are opposite in polarity, i.e. one is positive, and the other is negative. The vibration wave motor 50 applies high-frequency voltage almost equal to the natural frequency of the vibrator 52 to an A phase to which the electrodes A+ and A− correspond, with the electrodes AG+, AG− corresponding to an AG phase and facing the A phase and the electrodes BG+, BG− corresponding to a BG phase and facing a B phase to which the electrodes B+ and B− correspond, the B phase being different by 90 degrees in spatial phase from the A phase, being grounded. Further, the vibration wave motor 50 applies high-frequency voltage equal in natural frequency to and electrically different in phase by 90 degrees from the high-frequency voltage applied to the A phase to the B phase. This causes the vibrator 52 to generate two bending vibrations intersecting with each other, whereby driving vibrations are obtained by synthesis of the generated two bending vibrations to thereby frictionally drive the rotor 59 integrated with the contact ring 59A disposed in contact with one end face of the elastic body 57 via the spring 63.

Next, a description will be given of the reason why the internal electrodes of the piezoelectric layers 5, 6 of the stacked piezoelectric element 55 are smaller in outer diameter than those of the piezoelectric layers 7 to 11 and those of the piezoelectric layers 2 to 4 are further smaller in outer diameter.

Figure 3:
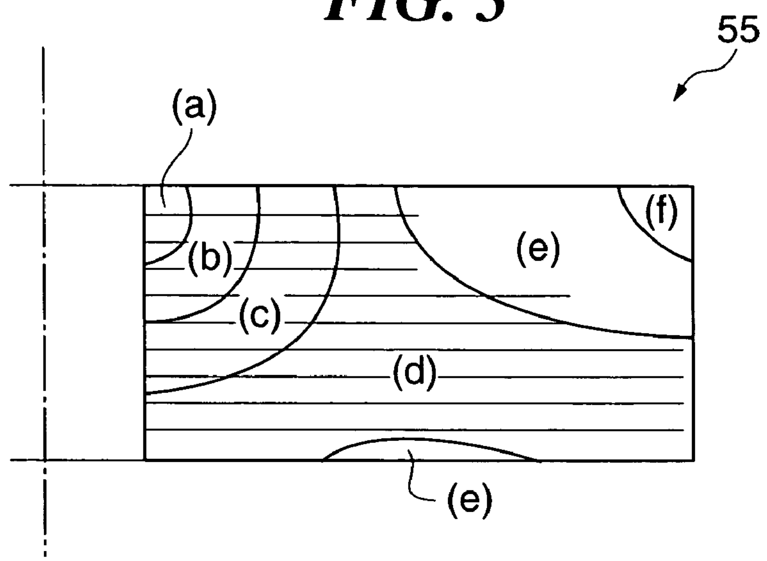
FIG. 3 is a fragmentary vertical cross-sectional view of the stacked piezoelectric element of FIGS. 2A and 2B, useful in explaining a desired strain distribution that is to occur in the stacked piezoelectric element having internal electrodes A+ and AG+.

FIG. 3 is a fragmentary vertical cross-sectional view of the stacked piezoelectric element in FIGS. 2A and 2B, useful in explaining a desired strain distribution in the stacked piezoelectric element.

FIG. 3 shows a distribution of strains caused by elongation of the stacked piezoelectric element 55 when elongation and contraction of the same occur in the thickness direction by vibrations of the internal electrodes A+ or AG+ for example. The strain distribution is such that in an upper part of the stacked piezoelectric element toward the rotor 59, the strain is the largest at the inner periphery (region (a)); the strain becomes smaller toward the outer periphery of the stacked piezoelectric element and toward a lower side of the same (regions (b), (c), (d)); and the strain becomes almost zero in a region (e). In a region (f) at an upper and radially outer part of the piezoelectric element, a strain occurs, which is inverse in direction to the direction of strains in the regions (a) to (d), i.e. a strain caused by contraction. Such a strain distribution is determined by principal factors such as dimensions, shapes and materials of the piezoelectric element 55, the elastic bodies 54, 57, and 58, and the shaft 51, and is likely to occur in a compact vibrator, that is, a flat vibrator having a short length as shown in FIG. 1 in particular.

The strain distribution in FIG. 3 shows that no strain needs to occur in the region (e), and in the upper and radially outer region (f), a strain should occur, which is inverse in direction to strains that should inherently occur in the piezoelectric element. In particular, in this region, a strain caused by elongation of the piezoelectric element is of no use and can even cause loss of supplied electric power. Therefore, to eliminate the upper and radially outer region in which strains are generated, the electrode layers are configured such that they gradually decrease in outer diameter.

As described above, according to the present embodiment, the internal electrodes of the stacked piezoelectric element 55 are different in dimensions in accordance with strains that are desired to occur in the stacked piezoelectric element 55. This enables the vibrator to generate vibrations in an effective manner, to thereby make it possible to provide a more compact vibration wave motor with higher output power and enhanced operating efficiency.

Although in the present embodiment, the internal electrodes shown in FIG. 3 have three different dimensions or sizes, it may be configured such that all the electrode layers have respective different dimensions or sizes as appropriate. However, in an actual vibration wave motor, if the internal electrodes of the piezoelectric layers 5 and 6 are equal in dimensions to those of the piezoelectric layers 2 to 4 and/or to those of the piezoelectric layers 7 to 11, advantageous effects can be provided. Using only such two different-sized internal electrodes can reduce the manufacturing cost, thus providing practically useful effects.

The stacked piezoelectric element 55 is manufactured as follows: First, through holes for through electrodes are formed in green sheets of piezoelectric ceramic powder and an organic binder for forming piezoelectric layers of the piezoelectric element 55. Then, patterns of silver-palladium powder paste for forming internal electrodes are formed by screen printing and the formed patterns are laid over the respective green sheets. Next, the green sheets are stacked one upon another, and are pressurized while being heated into a laminated structure. Before being sintered, a central opening is formed in the laminated structure by machining. The laminated structure is then sintered in a lead atmosphere at approximately 1100. After the sintering, polarization of the laminated structure is performed. Then the laminated structure is subjected to double-side lapping. Finally, the outer periphery of the laminated structure is machined or ground, thus completing a stacked piezoelectric element.

In this way, the stacked piezoelectric element 55 according to the present embodiment has internal electrodes configured to have appropriately different dimensions in the stacked direction according to a strain distribution desired to occur in the piezoelectric element, whereby the vibrator can be vibrated with higher efficiency, thus resulting in higher output power (rotational speed×torque) and enhanced operating efficiency of the vibration wave motor, compared with the conventional stacked piezoelectric element having internal electrodes uniform in dimensions.

Figure 4:
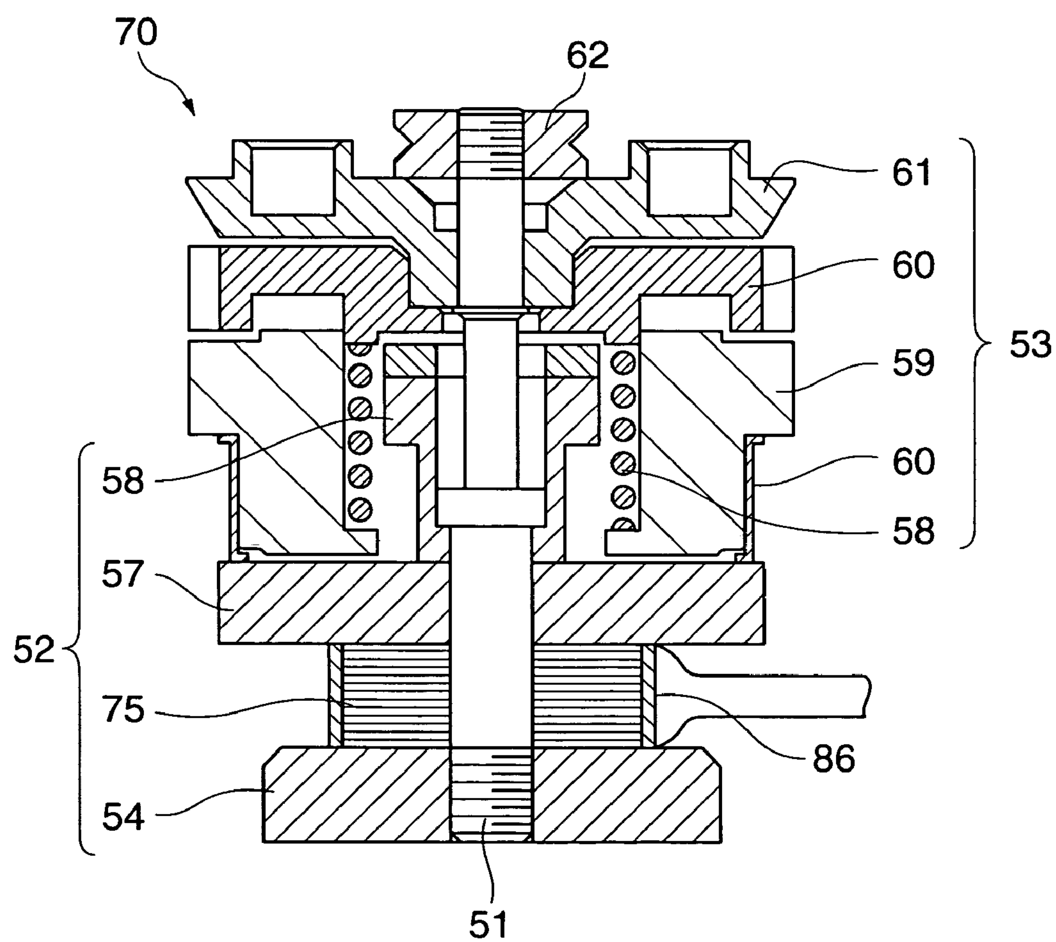
FIG. 4 is a cross-sectional view of a vibration wave motor according to a second embodiment of the present invention.

FIG. 4 is a cross-sectional view of a vibration wave motor according to a second embodiment of the present invention.

The second embodiment is basically identical or similar in configuration to the first embodiment described above. In FIG. 4, the same or similar elements or parts are designated by like reference numerals, and duplicate description thereof is omitted. In the following, only component elements different from the first embodiment will be described.

Figure 5A:
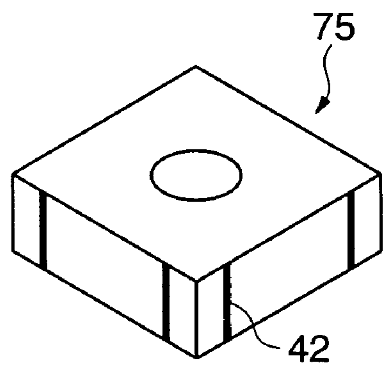
FIG. 5A is a perspective view of a stacked piezoelectric element appearing in FIG. 4.
Figure 5B:
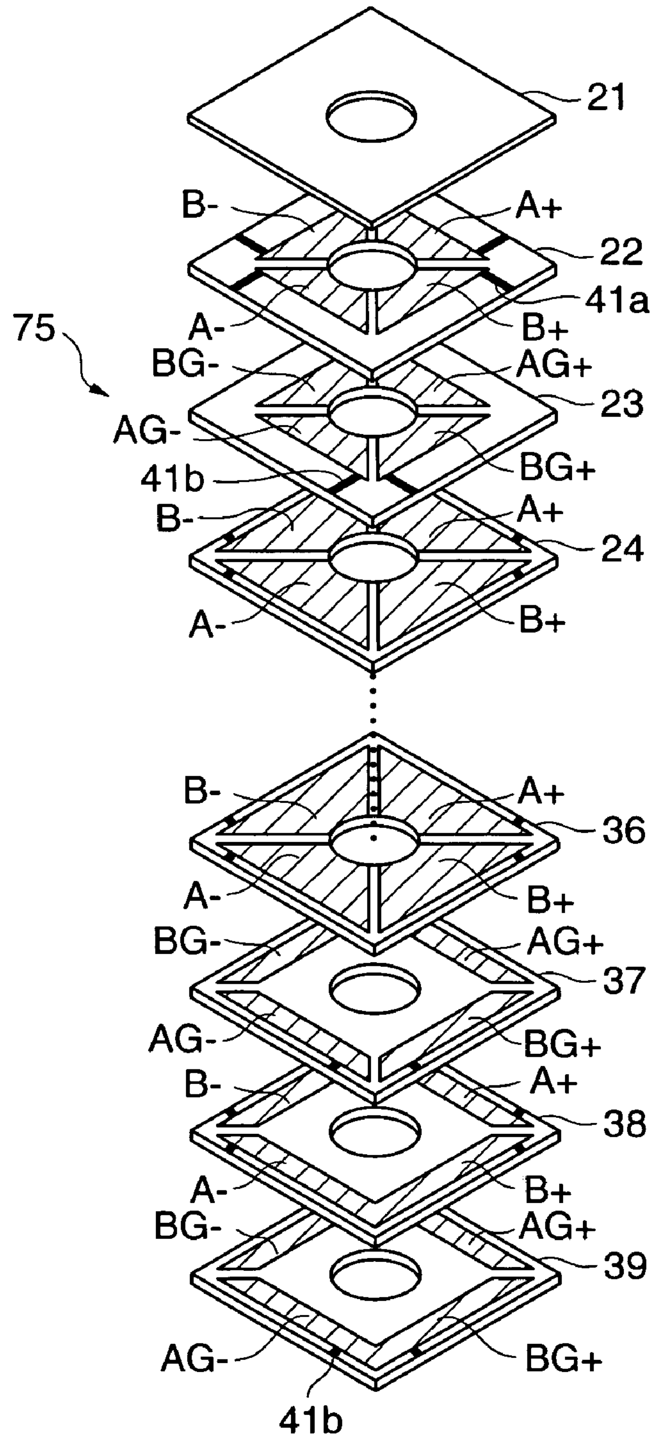
FIG. 5B is an exploded perspective view of the stacked piezoelectric element in FIG. 4.

As shown in FIG. 4, a vibration wave motor 70 has a stacked piezoelectric element 75 having a quadrangular or square cross section as shown in FIGS. 5A and 5B. The vibration wave motor 70, however, does not include a PCB 56 as shown in FIG. 1. The stacked piezoelectric element 75 has an outer peripheral surface thereof formed with eight external electrodes 42 at four corners thereof, two electrodes being formed at each corner. A PCB 86 is mounted on an outer periphery of the element 75 in a manner covering the external electrodes 42, and is connected to the external electrodes 42 and an external power supply (not shown).

FIGS. 5A and 5B illustrate the stacked piezoelectric element 75 in FIG. 4. Specifically, FIG. 5A is a perspective view of the piezoelectric element 75, and FIG. 5B is an exploded perspective view of the same.

As shown in FIG. 5A, the stacked piezoelectric element 75 has a square pole-like shape and has dimensions of a width and breadth of 5 mm, an inner diameter of 1.7 mm and a thickness (height) of approximately 0.7 mm. As shown in FIG. 5B, the stacked piezoelectric element 75 is comprised of a first or uppermost quadrangular piezoelectric layer 21, and lower, second to nineteenth quadrangular piezoelectric layers 22 to 39. The quadrangular piezoelectric layers 21 to 39 each may have a thickness of approximately 35 micrometers (μm). It should be noted, however, that the above-mentioned dimensions are given only as an example. The dimensions may have other values depending on parameters required for a particular stacked piezoelectric element, such as output power and entire length.

The even-numbered piezoelectric layers 22, 24, - - - , 38 each have four segmented electrodes A+, B+, A−, and B− formed in a surface thereof facing the first or uppermost layer 21 and separated from one another by a generally cross-shaped slit where no electrode is formed, and the odd-numbered piezoelectric layers 23, 25, - - - , 37, - - - 39 each have four segmented internal electrodes AG+, BG+, AG−, and BG− similarly formed in a surface thereof facing the first layer 21.

In the stacked piezoelectric element 75 in FIG. 4, to realize the strain distribution desired to occur in the stacked piezoelectric element 75, the piezoelectric layers 24 to 36 have the internal electrodes formed over substantially the entire surface thereof, the piezoelectric layers 22 and 23 have the internal electrodes formed only over a radially inner surface part thereof, and the piezoelectric layers 37 to 39 have the internal electrodes formed over only over a radially outer surface part thereof. That is, in the present embodiment, to eliminate an upper and radially outer region and a lower and radially inner region in which strains occur, the internal electrodes are configured such that the radially outer region and the radially inner region become smaller toward an upper end of the stacked piezoelectric element 75. The internal electrodes each have a thickness of 2 to 3 μm, as is the same with the first embodiment.

Out of the piezoelectric layers 22 to 39, the even-numbered piezoelectric layers have connecting electrodes **41*a* for connection with the external electrodes 42, formed at four locations, i.e. two electrodes at each of a pair of diametrically opposite corners of the stacked piezoelectric element 75, and the odd-numbered piezoelectric layers have connecting electrodes 41*b* for connection with the external electrodes 42, formed at four locations, i.e. two electrodes at each of the other pair of diametrically opposite corners of the stacked piezoelectric element 75**.

The operation and manufacturing method of the vibration wave motor 70 according to the present embodiment are substantially the same as those of the first embodiment.

Compared with the conventional vibration wave motor having a stacked piezoelectric element with uniform internal electrodes, the vibration wave motor 70 of the present embodiment having the non-uniform internal electrode configuration can be designed compact in size and provide enhanced operating efficiency.

Although in the above described embodiments, stacked piezoelectric elements with a central opening are provided, the stacked piezoelectric element may be configured without any central opening.

Although in the above described embodiments, stacked piezoelectric elements having circular and quadrangular shapes are provided, the stacked piezoelectric element may have any other polygonal shapes. Similarly, the internal electrodes may have any suitable shapes including a circle, quadrangle, and other polygons. In a stacked piezoelectric element having a circular cross section, internal electrode layers having different inner and/or outer diameters may be used. In a stacked piezoelectric element having a quadrangular or polygonal cross section, internal electrode layers having different inner and/or outer diameters may be used.

As many apparently widely different embodiments of the present invention can be made without departing from the spirit and scope thereof, it is to be understood that the invention is not limited to the specific embodiments thereof except as defined in the claims.

CROSS REFERENCE TO RELATED APPLICATION

This application claims priority from Japanese Patent Application No. 2004-176707 filed Jun. 15, 2004, which is hereby incorporated by reference herein.

What is claimed is:

1. A stacked type electromechanical energy conversion element comprising:

a plurality of stacked electromechanical energy conversion material layers having respective surfaces;

a plurality of electrode layers formed, respectively, on the one surfaces of said plurality of material layers, said material layers and said electrode layers being stacked one upon another; and electrodes formed at least in said plurality of material layers for providing electrical connections between corresponding ones of said plurality of electrode layers, wherein said plurality of electrode layers have a non-uniform configuration depending on a predetermined strain distribution that is to occur in the stacked type electromechanical energy conversion element.

2. The stacked type electromechanical energy conversion element according to claim 1, having one surface thereof located on one side thereof in a direction in which said material layers and said electrode layers are stacked, and said plurality of electrode layers have outer diameters gradually decreasing toward the one surface of said device.

3. The stacked type electromechanical energy conversion element according to claim 1, having one surface thereof located on one side thereof in a direction in which said material layers and said electrode layers are stacked, and said plurality of electrode layers have inner diameters gradually decreasing toward the one surface of said device.

4. The stacked type electromechanical energy conversion element according to claim 1, wherein each of said plurality of electrode layers has a circular shape.

5. The stacked type electromechanical energy conversion element according to claim 1, wherein each of said plurality of electrode layers has a polygonal shape.

6. The stacked type electromechanical energy conversion element according to claim 5, wherein said polygonal shape is a square.

7. A vibration wave driving apparatus comprising:

a vibrator having a surface thereof, said vibrator including a stacked type electromechanical energy conversion element for inducing a vibration wave on the surface of said vibrator, when electrically driven; and a moving unit disposed in contact with the surface of said vibrator, said moving unit being driven by the vibration wave, wherein said stacked type electromechanical energy conversion element comprises:

a plurality of stacked electromechanical energy conversion material layers having one surface;

a plurality of electrode layers formed, respectively, on the one surfaces of said plurality of material layers, said material layers and said electrode layers being stacked one upon another; and electrodes formed at least in said plurality of material layers for providing electrical connections between corresponding ones of said plurality of electrode layers, and wherein said plurality of electrode layers have a non-uniform configuration depending on a predetermined strain distribution that is to occur in the stacked type electromechanical energy conversion element.

8. The vibration wave driving apparatus according to claim 7, wherein said plurality of electrode layers have outer diameters gradually decreasing toward said moving unit.

9. The vibration wave driving apparatus according to claim 7, wherein said plurality of electrode layers have inner diameters gradually decreasing toward said moving unit.

10. The vibration wave driving apparatus according to claim 7, wherein:

said vibrator comprises first, second, and third elastic bodies, said first elastic body, said stacked type electromechanical energy conversion element, said second elastic body, and said third elastic body are arranged in an order mentioned, and said stacked type electromechanical energy conversion element has an outer diameter smaller than that of said second elastic body and larger than that of said third elastic body.

* * * * *

UNITED STATES PATENT AND TRADEMARK OFFICE

CERTIFICATE OF CORRECTION

PATENT NO. : 7,183,699 B2
APPLICATION NO. : 11/151375
DATED : February 27, 2007
INVENTOR(S) : Yutaka Maruyama et al.

It is certified that error appears in the above-identified patent and that said Letters Patent is hereby corrected as shown below:

On the title page item (73), ASSIGNEE: The Assignee is incorrect and should appear as follows:

--CANON KABUSHIKI KAISHA--

Signed and Sealed this

Seventeenth Day of April, 2007

JON W. DUDAS

*Director of the United States Patent and Trademark Office*